United States Patent [19]
Usuki

[11] Patent Number: 5,377,140
[45] Date of Patent: Dec. 27, 1994

[54] CELL FOR RANDOM ACCESS MEMORY

[75] Inventor: Hideki Usuki, Kanagawa, Japan

[73] Assignee: Sony Corporation, Tokyo, Japan

[21] Appl. No.: 150,544

[22] Filed: Nov. 10, 1993

Related U.S. Application Data

[63] Continuation of Ser. No. 798,699, Nov. 26, 1991, abandoned.

[30] Foreign Application Priority Data

Nov. 27, 1990 [JP] Japan .................... 1-320673

[51] Int. Cl.5 .............................. G11C 11/00
[52] U.S. Cl. .................... 365/154; 257/538; 257/903; 257/904
[58] Field of Search ............... 365/154; 357/51, 23.9; 257/538, 903, 904

[56] References Cited

U.S. PATENT DOCUMENTS

| | | | |
|---|---|---|---|
| 4,805,147 | 2/1989 | Yamanaka et al. | 365/154 |
| 4,890,148 | 12/1989 | Ikeda et al. | 357/45 |
| 4,975,875 | 12/1990 | Ito | 365/154 X |
| 4,995,000 | 2/1991 | Tenell | 365/154 |
| 5,132,929 | 7/1992 | Ochii | 365/154 X |

Primary Examiner—Eugene R. LaRoche
Assistant Examiner—Do Hyum Yoo
Attorney, Agent, or Firm—Hill, Steadman & Simpson

[57] ABSTRACT

The memory ratio is improved and the data holding ability on reading data is enhanced by providing a resistive element between an access transistor and a flip-flop, which form a memory cell of a static memory. Even if the threshold voltage of the access transistor is lowered, the memory cell ratio can be increased. Accordingly, the minimum operating voltage can be lowered and the operating margin for a power source voltage can be increased and simultaneously with this, the soft error immunity can be enhanced. Since the memory cell ratio of the semiconductor memory of the present invention is enhanced by the resistive element, the necessity to preset a lower current drive ability of the access transistor for a drive transistor is decreased. As a result of this, the size of the memory cell can be decreased. Further, the current consumed by the memory cell is decreased by the resistive element.

5 Claims, 7 Drawing Sheets

CELL FOR RANDOM ACCESS MEMORY

This is a continuation of application Ser. No. 798,699, filed Nov. 26, 1991, now abandoned.

BACKGROUND OF THE INVENTION

1. Field of the Invention

The present invention relates to a static random access memory in which each memory cell comprises a flip-flop and access transistors.

2. Description of the Prior Art

Static semiconductor memories (SRAM) in which each memory cell comprises a flip-flop and access transistors have been widely used in general information processing systems since they have less restrictions on operation and short access time.

Figure 1:
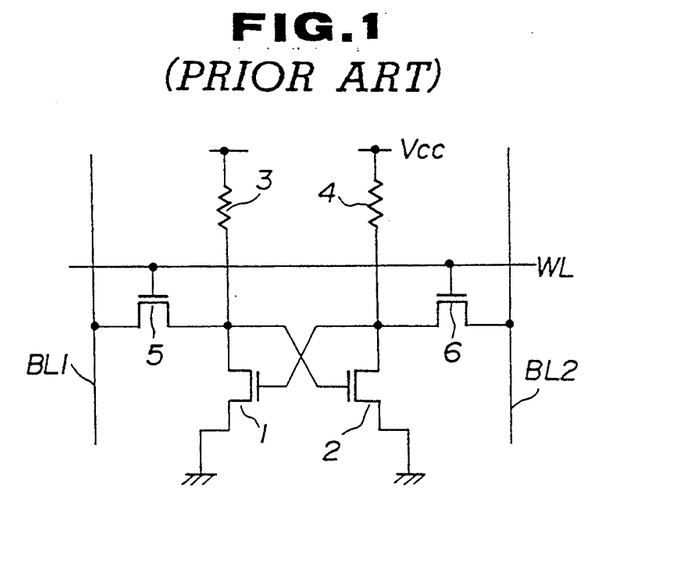
FIG. 1 is a circuit diagram showing a prior art static memory cell.

Referring now to FIG. 1, there is shown a circuit diagram showing a prior art static memory cell. The memory cell comprises pairs of a resistor 3 and an nMOS transistor 1 and a resistor 4 and an nMOS transistor 2. Each pair of the resistor and the nMOS transistor forms an inverter and is connected in series between a power source voltage Vcc and a ground voltage GND. The resistors 3 and 4 and the nMOS transistors 1 and 2 form a flip-flop. The drain of each of the nMOS transistors 1 and 2 is a memory node. The drain of the nMOS transistor is connected with a bit line BL1 via an nMOS transistor 5 which is an access transistor. The drain of the nMOS transistor 2 is connected with a bit 11he BL2 via an nMOS transistor 6 which is an access transistor.

Figure 2:
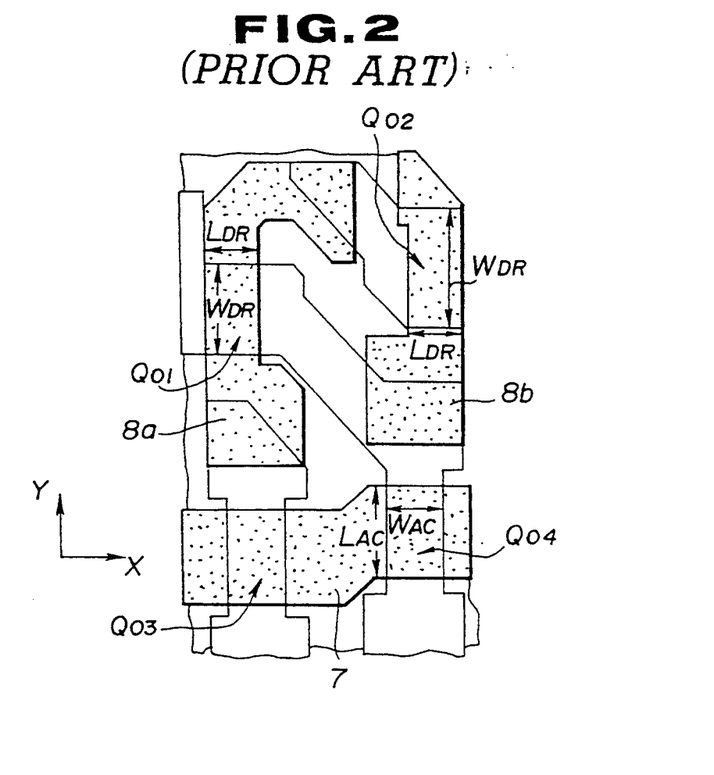
FIG. 2 is a plan view showing the layout of the cell of FIG. 1.

Referring now to FIG. 2, there is shown a layout on a chip, the circuit of which is shown in FIG. 1. The word line, which is marked WL in FIG. 1, is comprised of a polysilicon layer 7 and the gate electrodes of the drive transistors 1 and 2 are comprised of polysilicon layers 8a and 8b. On this layout, the gate length $L_{AC}$ of the access transistor and the gate width $W_{OR}$ of the drive transistor determined the cell size in a Y direction of the drawing and the gate length $L_{DR}$ of the drive transistor and the gate width $W_{AC}$ of the access transistor determine the cell size in an X direction of the drawing. The source/drain region of each transistor is formed by a gate electrode and a field oxide film (formed by LOCOS process) by a self-alignment technique.

However, the semiconductor memory having the above-mentioned structure is difficult to achieve in high density integration and is disadvantageous in terms of consumed current and data holding capability.

In order to provide a high data holding ability on reading data and a high noise margin, it is necessary to provide a high memory cell ratio $\beta_{DR}/\beta_{AC}$ ($=W_{DR} L_{AC}/W_{AC} L_{DR}$). In order to provide a high memory cell ratio, it is necessary to preset the size of a memory cell so that the gate width $W_{DR}$ and the gate length $L_{AC}$ are increased and the gate width $W_{AC}$ and the gate length $L_{DR}$ are decreased. As is apparent from FIG. 2, both the gate width $W_{DR}$ of the drive transistors and the gate length of the access transistor are of a greater size in the Y-direction. Accordingly, if they are increased to provide a high ratio, the cell size cannot be decreased. High density integration would become difficult.

If the supplied power source voltage Vcc is less, consumed power is less and high density integration is possible. However, in the memory cell having the above-mentioned structure, the minimum operating power source voltage Vccmin is determined by a sum of $Vth_{DR}$ (threshold voltage of the drive transistor), $Vth_{AC}$ (threshold voltage of the access transistor) and $\Delta Vth_{AC}$ (a substrate effect of the threshold voltage of the access transistor). The $Vth_{AC}$ is preset high in order to provide a high memory cell ratio. The gate width $W_{AC}$ is minimized. Accordingly, $\Delta Vth_{AC}$ is made relatively high by a narrow channel effect. Therefore, lower minimum operation power source voltages cannot be used and the potential at the memory node is lowered, resulting in difficulty in improving soft error immunity.

SUMMARY OF THE INVENTION

It is an object of the present invention to provide a semiconductor memory having a novel cell structure which achieves reduction in cell size, enhancement in data holding ability and low power consumption.

In order to accomplish the above mentioned object, the present invention provides a semiconductor memory having memory cells each including a flip-flop comprising a pair of inverters and a pair of access transistors, characterized in that a resistive element is disposed between the flip-flop and each of the access transistors.

Although the resistive element may be formed of a wiring layer such as polysilicon layer, it may be a diffusion resistive element comprising a dopant diffusion region formed on the surface of a substrate. The resistance value of the resistive element may be about several tens kohms to several hundred kohms.

In the semiconductor memory of the present invention, the access and drive transistors may be preset so that they have the same size and the same driving ability.

In the semiconductor memory of the present invention, the flip-flop and the access transistors comprise NOS transistors. In this case, the resistive element may be of a structure which may be adjusted by an dopant introduced by a self alignment with the gate of the MOS transistor. If the element isolation of the semiconductor memory is carried out by a field insulation film such as LOCOS film, the resistive element can be formed by an ion implantation by a self alignment with the field insulation film.

The value of the memory cell ratio is changed by disposing a resistive element between the flip-flop and the access transistors. Since the added resistive element positively biases the source of the access transistor, the current carrying ability of the access transistor is decreased. Accordingly, the necessity of a long gate length for the access transistor is eliminated so that reduction of the cell size becomes possible. Since the memory cell ratio can be increased by the resistive element, the current carrying ability of the access transistor can be made equal to that of the drive transistor. As a result of this, the threshold voltage VthAC of the access transistor can be lowered. Since the narrow channel effect is suppressed, the threshold voltage variation $\Delta Vth_{AC}$ is also lowered. Accordingly, the minimum operating power source voltage Vccmin is also lowered while the potential at the memory node in the high level side is elevated. Therefore, immunity against soft error is improved.

DETAILED DESCRIPTION OF THE PREFERRED EMBODIMENT

Preferred embodiments of the present invention will be described with reference to drawings.

The present embodiment of a static semiconductor memory has a structure in which a resistive element is disposed between a flip-flop and an access transistor, resulting in a high density integration and an improvement in memory cell ratio.

Figure 3:
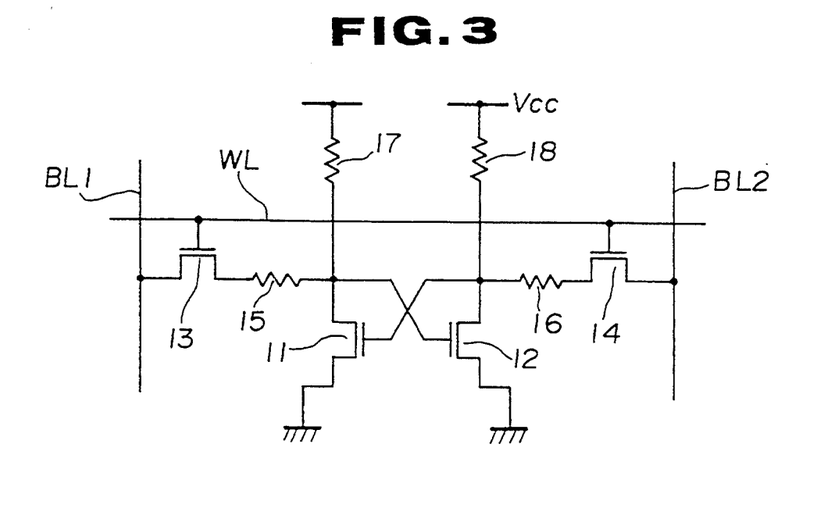
FIG. 3 is a circuit diagram showing a memory cell of a static RAN of the present invention.

A circuit diagram of the embodiment of a cell for a static random access memory is shown in FIG. 3.

The memory cell substantially comprises four MOS transistors and four resistive elements. A flip-flop circuit in this cell comprises nMOS transistors 11 and 12 which serve as drive transistors and resistive elements 17 and 18. The nMOS transistors 11 and 12 have sources which are commonly grounded and gates which are connected with the drains of the other transistors 11 and 12. The resistive elements 17 and 18 are supplied with a power source voltage Vcc at one end thereof and are connected with the drains of the NOS transistors 11 and 12 at the other end thereof. The access transistors comprise nMOS transistors 13 and 14. The nMOS transistor 13 is connected with a bit line BL1 at one of the source/drain thereof and is connected with a word line WL at the gate thereof. The nMOS transistor 14 is connected with a bit line BL 2 at one of the source and the drain thereof and is connected to the word line WL at its gate. Accordingly, the access transistors are in a transmissive state when the word line WL is in the high level. The access transistors are in a non-transmissive state when the word line WL is at the lower level. The bit lines BL1 and BL2 form a pair of lines which are used for writing and reading a data to and from the cell. The other of the source and the drain of each of the nMOS transistors 13 and 14 is connected with one end of each of the resistive elements 15 and 16. The resistive elements 15 and 16 are connected between the access transistors 13 and 14 and the flip-flop for the purpose of increasing the capacity of the drive transistors 11 and 12 for current driving the access transistors, 13 and 14 as will be described hereafter. The other ends of the resistive elements 15 and 16 are connected with the drains of the nMOS transistors 11 and 12.

Operation of the circuit of FIG. 3 will be described. When the memory cell is in a receptive state, the word line is at a high level so that the nMOS transistors 13 and 14 which are access transistors are turned on.

Data is transferred between the bit lines BL1, BL2 and the flip-flop circuit via the nMOS transistors 13 and 14 to achieve data writing and reading.

Figure 5A:
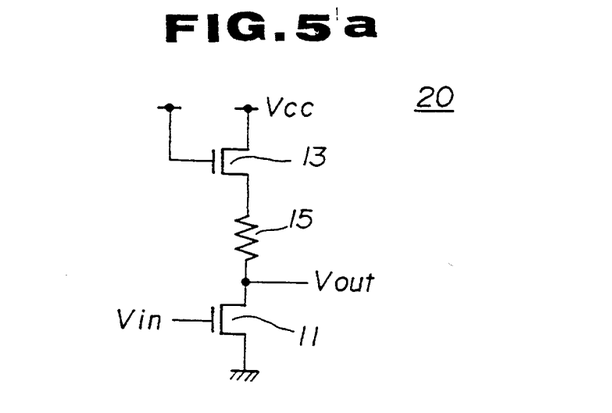
FIG. 5a is a circuit diagram showing an inverter forming the memory cell shown in FIG. 3.

The elements which function as inverter in the memory cell when data is held, that is, when the cell is in a non-receptive state are nMOS transistors 11, 12 and resistive elements 17 and 18. However, it can be assumed that a pair of inverter is formed by an access transistor and a drive transistor when the data is read. It can be assumed in the present embodiment, that a set of nMOS transistors 11 and 13 and the resistive element 15, as shown in FIG. 5a, and a set of nMOS transistors 12, 14 and the resistive element 16 form respective inverter. If the characteristics of the inverter having the resistive elements 15 and 16 interposed therein are excellent, the characteristics of data holding state are excellent. In the present embodiment, the inverter comprising the access transistor and the drive transistor have the resistive elements 15 and 16 connected in series with the nMOS transistors 13 and 14 which are access transistors Such an interposition of the resistive elements 15 and 16 increases the current drive capacity $\beta_{AC}$ of the access transistor to provide a necessary memory cell ratio. As a result of this, the gate length of $L_{AC}$ of the nMOS transistors 13 and 14 can be shortened. Such a shortening of the gate length $L_{AC}$ provides finer memory cells. Since the current drive capacity $\beta_{AC}$ of the nMOS transistor 13 and 14 can be increased, the threshold voltage $Vth_{AC}$ may be decreased to a low value. The threshold voltage variation $\Delta Vth_{AC}$ which is defined in consideration of a substrate effect will also become a low value since the narrow channel effect is reduced due to an increase in the transistor channel size. As a result of this, the minimum operative power source voltage Vccmin which is represented by $Vth_{DR}+Vth_{AC}+\Delta Vth_{AC}$ can be decreased.

Figure 5B:
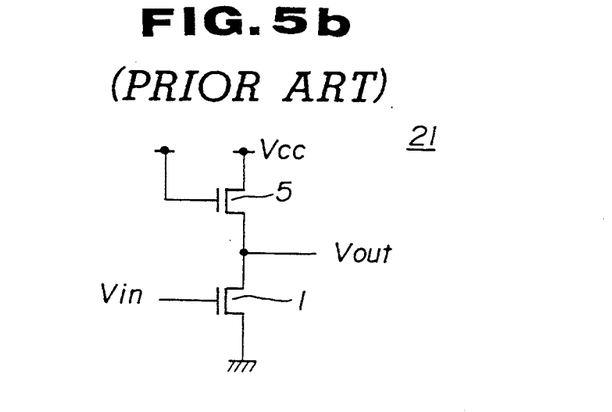
FIG. 5b is a circuit diagram showing an inverter forming the memory cell shown in FIG. 1.
Figure 7:
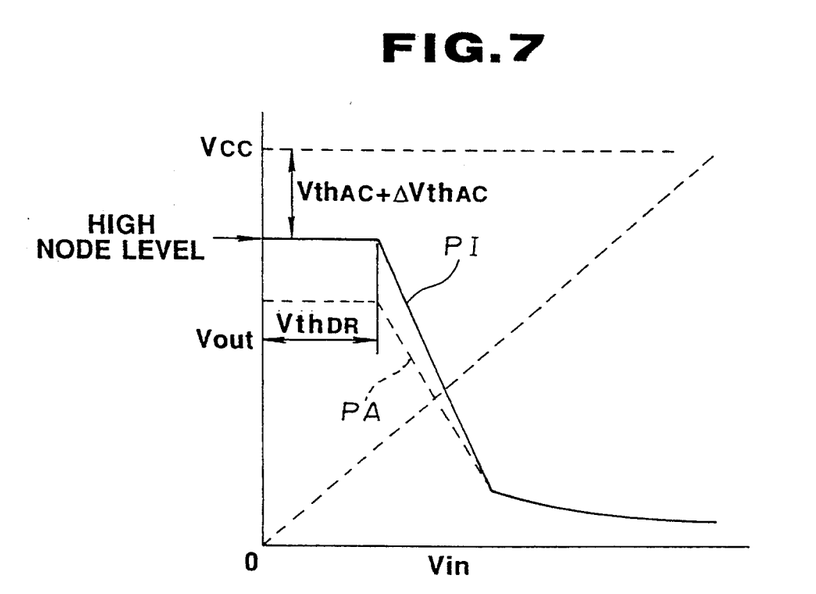
FIG. 7 is a graph comparatively showing the input-/output characteristics of the inventive and prior art memory cells which are shown in FIGS. 5a and 5b, respectively.

FIG. 7 is a graph comparatively showing the input-output characteristics of the inverter 80 shown in FIG. 5a which forms a memory cell of the present invention and an inverter 81 shown in FIG. 5b which forms a prior art memory cell, A solid line PI in FIG. 7 represents the input-output characteristics of the inverter 80 of the present invention. When the input voltage Vin is lower than the $Vth_{DR}$, the threshold voltage of the drive transistor, the output voltage Vout is $Vcc - Vth_{AC} - \Delta Vth_{AC}$. As the access voltage $Vth_{AC}+\Delta Vth_{AC}$ decreases, the output voltage Vout increases in comparison with the characteristics of the prior art as represented by a dotted line PA as mentioned above. As the current drive capacity $\beta_{AC}$ of the access transistors is increased and the threshold voltage of the access transistors $Vth_{AC}+\Delta Vth_{AC}$ decreases, the potential of a memory node at the high level can be increased. As a result of this, immunity against soft error can be enhanced.

In the semiconductor memory of the present embodiment, the current drive ability $\beta_{AC}$ of the access transistors can be thus increased by inserting the resistive elements 15 and 16 in series with the nMOS transistors 13 and 14, respectively. Simultaneously with this, a higher memory cell ratio can be obtained. In other words, the resultant current drive ability of the resistive elements 15, 16 and the nMOS transistors 13 and 14 can be suppressed to a low value while the current drive ability of the nMOS transistors is increased by connecting the resistive elements 15 and 16 in series with the access transistors. As a result of this, the memory cell ratio which is a ratio of the current drive ability of the drive transistor to that of the access transistor can be further improved to increase the data holding ability on reading of data.

Figure 4:
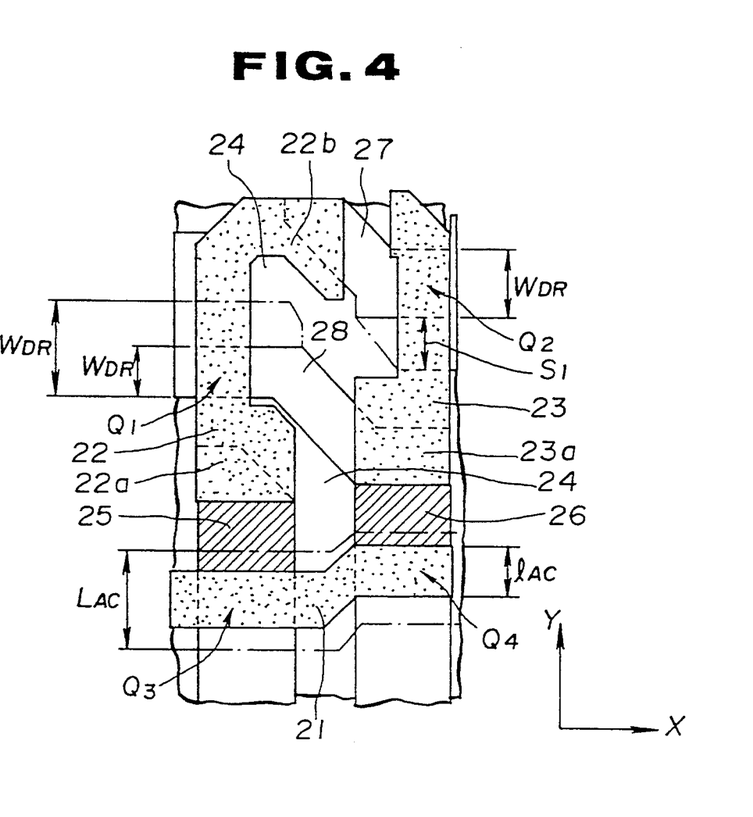
FIG. 4 is a plan view showing a layout of the cell of FIG. 3.

A layout of the detailed memory structure is shown in FIG. 4. The memory cell in this layout comprises polysilicon layers 21, 22 and 23 and a source/drain region and field oxide film 24. The field oxide layer 24 comprises a thick oxide film which is selectively formed on a silicon substrate, The field oxide layer 24 is used for isolating elements. The polysilicon layers 21 to 23 are formed on a silicon substrate via a gate insulating film.

The polysilicon layer 21 is a word line and extends in an X direction and is curved in its course in the memory cell. The polysilicon layer 21 functions as gate electrodes of access transistors $Q_3$ and $Q_4$. The polysilicon layer 22 has a substantially inverted J-shaped pattern and functions as a gate electrode of a drive transistor $Q_1$. The polysilicon layer 22 has opposite ends which are connected with respective diffusion regions. Specifically, the polysilicon layer 22 has an one end 22a which is connected with a resistive region 25 which is formed by a diffusion resistive element and the other end 22b which is connected with a drain region 27 of a drive transistor $Q_2$ forming a pair with the drive transistor $Q_1$. The polysilicon layer 23 has a substantially I-shaped pattern and functions as a gate electrode of the drive transistor $Q_2$. The polysilicon layer 23 has an end 23a which is connected with a resistive region 26 which is formed by a diffusion resistive element and is connected with the drain region 28 of the drive transistor $Q_1$.

The memory cell on such a layout has a circuit configuration shown in FIG. 3 so that the resistive regions 25, 26 function as resistive elements between the polysilicon layer 21 and the polysilicon layers 22, 23. Although loading resistive elements for the flip-flop circuit is formed by, for example, high resistive polysilicon layers, illustration thereof is omitted. Since the resistive regions 25, 26 function as resistive elements which increases the memory cell ratio as mentioned above, the necessity to widen the gate width of the drive transistors and to extend the gate length of the access transistors is reduced.

Accordingly, in the present embodiment, as shown in the layout of FIG. 4, the gate lengths $l_{AC}$ of the access transistors $Q_3$ and $Q_4$ become shorter than the gate length $L_{AC}$ of the prior art as represented by a one dot and dash line in the drawing and the gate widths $W_{DR}$ of the drive transistors $Q_1$ and $Q_2$ become shorter by a length S1 than the gate width $W_{DR}$ of the prior art as represented by a one dot and dash line. High density integration of memory cells is achieved without deteriorating the data holding characteristics by shortening the gate lengths $l_{AC}$ of the access transistors $Q_3$ and $Q_4$ and the gate widths $W_{DR}$ of the drive transistors $Q_1$, $Q_2$ by using the diffusion resistive elements in such a manner.

Although the resistive regions 25 and 26 are inherently the source/drain region of either one of access transistors $Q_3$ and $Q_4$ and an n+ type high concentration impurity diffusion region which is drain regions of the drive transistors $Q_1$ and $Q_2$, they are made low dose regions so that they are highly resistive in the present embodiment. The resistance value is several tens to several thousand ohms in the form of sheet resistor. Since formation of a the resistive regions 25, 26 can be carried out by self-alignment as will be described hereafter, the semiconductor memory has an immunity against mask misalignment as will be described hereafter, the semiconductor memory has an immunity against mask misalignment and is excellent in reproducibility.

Figure 6:
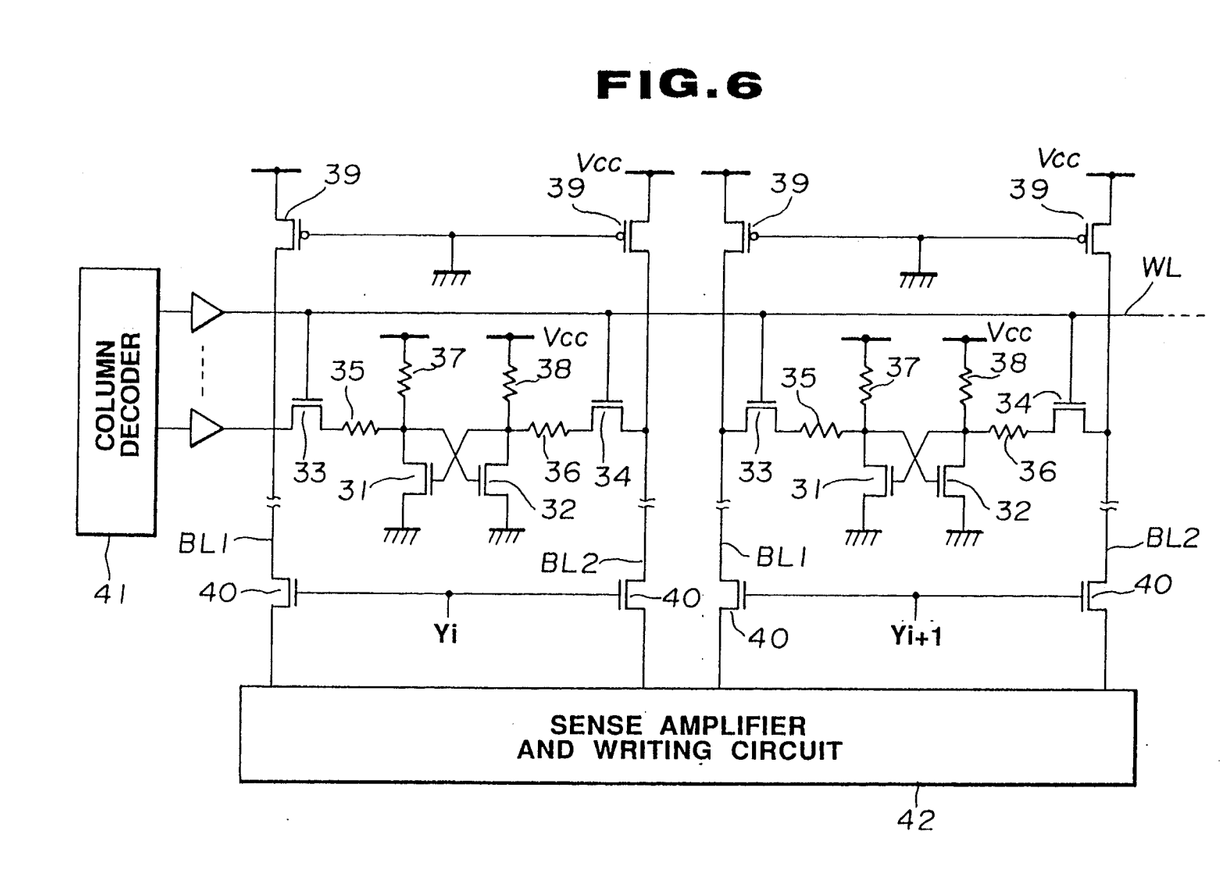
FIG. 6 is a circuit diagram showing a part of the memory in which the memory cells shown in FIG. 3 are arrayed.

FIG. 6 is a circuit diagram showing a part of a memory cell array comprising memory cells in which the resistive elements are interposed therein. Each memory cell comprises a flip-flop including nMOS transistors 31, 32 which are a pair of drive transistors and loading resistive elements 37 and 38, nMOS transistors 33 and 34 which are access transistors and resistive elements 35 and 36 which are connected in series with the transistors 33 and 34. In each memory cell, since each memory cell functions not to deteriorate the data holding ability even if the resistive elements 35 and 36 enhance the current drive ability of the access transistors, high integration of memory cells and enhancement in the data holding characteristics is achieved. These memory cells are arranged in a matrix as shown in the drawing.

Each memory cell is connected with a pair of bit lines BL1 and BL2 for reading and writing of data. Each memory cell is connected with word lines WL for column selection as gate electrodes for the access transistors. Each word line WL is selected by a column decoder 41. Loading MOS transistors 59 are disposed between the final terminals of the bit lines BL1 and BL2 and a line of a power source voltage Vcc. The levels of the bit lines BL1 and BL2 are adjusted by the load MOS transistors 59. MOS transistors for line selection are disposed in the bit lines BL1 and BL2. The MOS transistors 40 are brought into an operative state in response to a signal from a line decoder (not shown) so that only a selected line is coupled to a sense amplifier and writing circuit 42. The data to be written is input and the read data is amplified by this sense amplifier and writing circuit 42.

Figure 8:
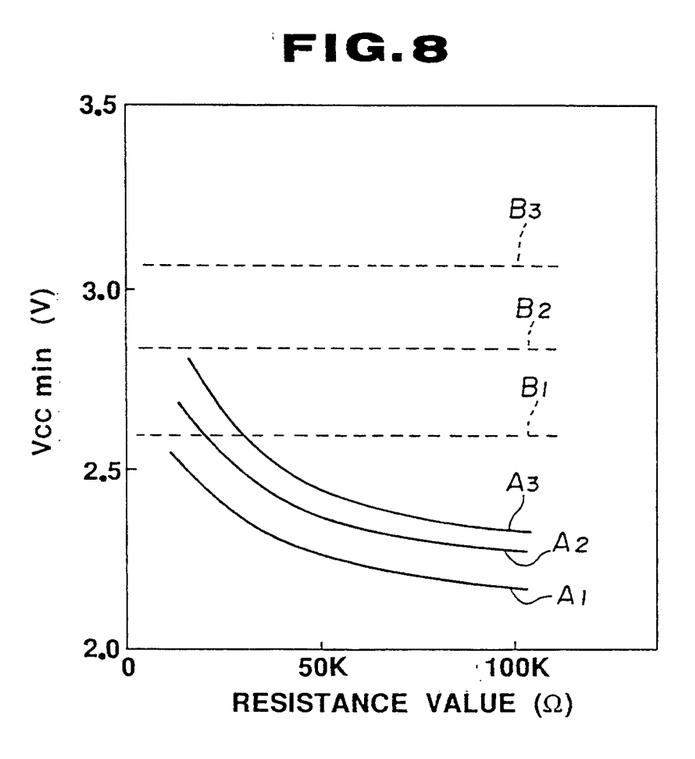
FIG. 8 is a graph showing the relation between the minimum operating voltage Vccmin of the memory cell of the present invention and the resistance value of a resistor interposed between an access transistor and a drive transistor.
Figure 10:
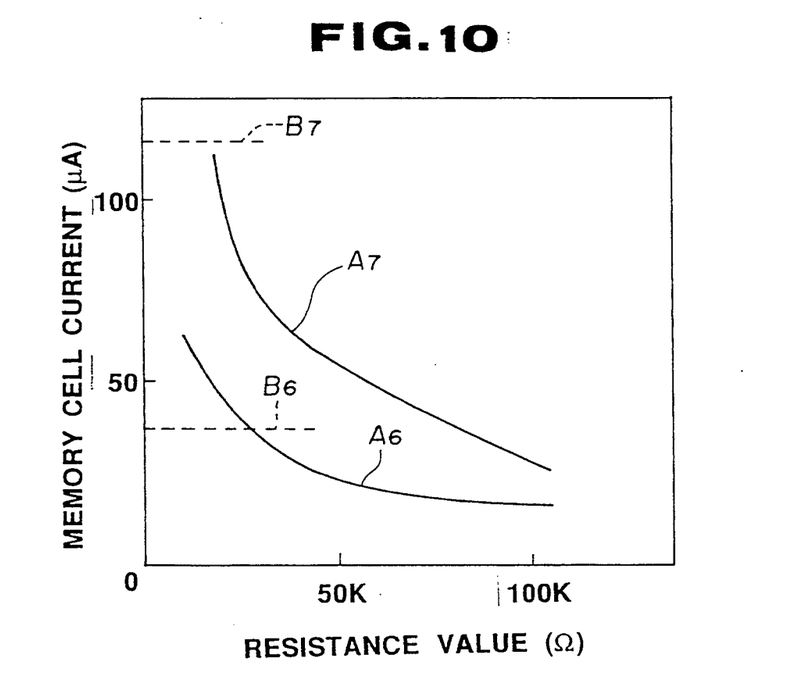
FIG. 10 is a graph showing the relation between the memory cell current of the present invention and the resistance value of a resistor interposed between an access transistor and a drive transistor.

Referring now to FIGS. 8 and 10, the advantages of the memory cell of the present embodiment will be described with reference to an experiment on the memory cell. The experiment was conducted by using the access and drive transistors commonly having a ratio of W/L of 1.9/0.8 and by changing a reference value of the resistor to 20K$\Omega$, 39K$\Omega$ and then to 100K$\Omega$. The data of the prior art represents the value of an inverter comprising access and drive transistors having no resistive elements. The W/L of the access and drive transistors are 1.0/1.5 and 1.9/0.8, respectively.

FIG. 8 shows the relation between the minimum operative power source voltage Vccmin and the resistance value of a resistor inserted between the access and the drive transistors. In the drawing, the ordinate represents the minimum operative power source voltage Vccmin and the abscissa represents the resistance value of a resistive element between the access transistor and the flip-flop. In FIG. 8, curves $A_1$ to $A_3$ correspond to the respective memory cells of the present embodiment.

The curve $A_1$ corresponds to a memory cell having no margin. The curve $A_2$ corresponds to a memory cell having a margin of 0.1V. The curve $A_3$ corresponds to a memory cell having a margin of 0.2V. Dotted lines $B_1$ to $B_3$ represent the minimum operating power source Voltage Vccmin when the memory cell is provided with no resistive elements. The dotted line $B_1$ corresponds to a memory cell having no margin. The dotted line $B_2$ corresponds to a memory cell having a margin of 0.1V. The dotted line $B_3$ corresponds to a memory cell $B_3$ having a margin of 0.2V. Accordingly, the effects of disposition of the resistive elements are understood by comparing the curves $A_1$, $A_2$ and $A_3$ with the dotted lines $B_1$, $B_2$ and $B_3$, respectively. As shown in FIG. 8, the curves $A_1$ to $A_3$ are lower toward the right side of the drawing. It is found that the lower minimum operative power source voltage Vccmin is obtained as the resistance value becomes the higher. The values of the minimum operative power source voltages Vccmin of the curves $A_1$ to $A_3$ are all lower than those of the corresponding dotted lines $B_1$ to $B_3$. This shows that operation at a lower voltage is assured by a memory cell of the present embodiment in which resistive elements are disposed. It is found that the data holding capacity is enhanced. It is confirmed that an improvement in the minimum operative power source voltage Vccmin by about 0.44 to 0.73 volts can be obtained when the resistance value is, for example, 100KΩ.

Figure 9:
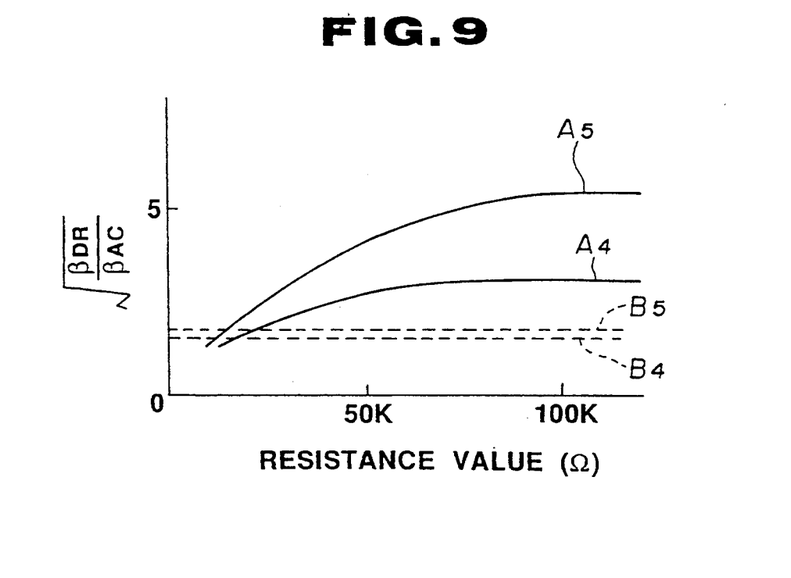
FIG. 9 is a graph showing the relation between the memory cell ratio of the present invention and the resistance value of a resistor interposed between an access transistor and a drive transistor.

FIG. 9 shows the relation between the memory cell ratio and the resistance value of a resistor inserted between the access transistor and the drive transistor. In the drawing, the ordinate represents the memory cell ratio $(\beta_{DR}/\beta_{AC})^{\frac{1}{2}}$ while the abscissa represents the resistance value of the resistor element between the access transistor and the flip-flop. In FIG. 9, the curves $A_4$ and $A_5$ correspond to the memory cells of the present embodiment. The Curves $A_4$ and $A_5$ correspond to the memory cells in which the voltage source Vcc is 3V and 5V, respectively. The dotted lines $B_4$ and $B_5$ represent the memory ratio in a case where no resistive elements are provided. The dotted lines $B_4$ and $B_5$ represent the memory cell ratios if the power source voltage Vcc is 3 and 5 volts, respectively. FIG. 9 shows that the memory cell ratio gradually increases as the resistance value increases. This increase in the memory cell ratio is particularly remarkable at 20KΩ. It is understood that the resistive element apparently functions as a part of an access transistor to contribute to an increase in the memory cell ratio.

FIG. 10 is a graph showing the relation between the memory cell current which flows during reading of the cell contents and the resistance value of a resistor inserted between an access transistor and a drive transistor. In the drawing, the ordinate represents the value (μA) of the memory cell current while the abscissa represents the resistance value (Ω). The curves $A_6$ and $A_7$ correspond to the memory cells of the present embodiment, in which the power source voltage Vcc is 3 and 5 volts, respectively. Dotted lines $B_6$ and $B_7$ represent memory cell ratios in a case where no resistive elements are provided and the power source voltage is 3 and 5 volts, respectively. If the memory cell current is excessively low, a delay in the access time would result. The memory cell current becomes lower than in the prior art memory cell when the power source voltage Vcc is 5 volts and the resistance value is 20KΩ or more. The memory cell current as high as the prior art is obtained when the power source voltage Vcc is 3 volts and the resistance value about 30KΩ. It is found from FIG. 10 that the memory cell current can be changed depending upon the resistance value and that a low current memory cell which can operates at a high speed can be provided by adjusting the resistance value of the resistive elements.

Figure 12:
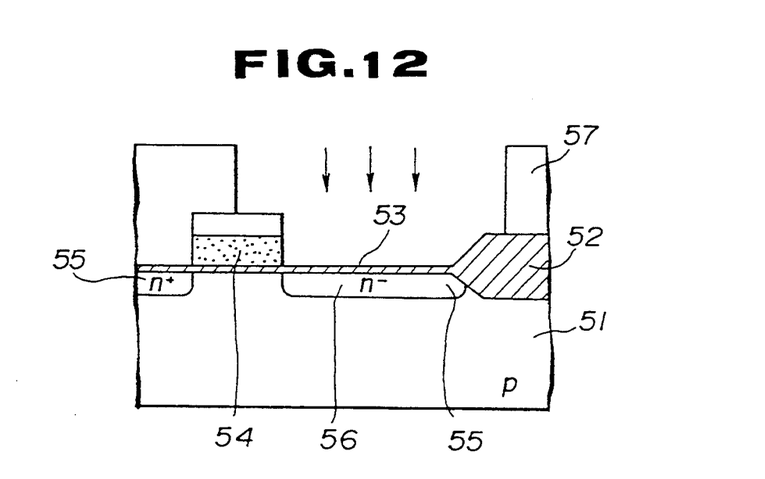
FIG. 12 is a sectional view showing the step for forming a low dose region of a memory cell by a self alignment technique.

The semiconductor memory of the present embodiment has a structure which is excellent in reproducibility in consideration of manufacturing processes. FIG. 12 is a sectional view showing a step for forming a low dose region by a self alignment. A field oxide film 52 of a thick oxide is selectively formed on the surface of the p-type silicon substrate 51 , A gate oxide film 53 is formed on the surface region where no field oxide film 52 is formed. A gate electrode 54 is formed on the gate oxide film 53. Dopant diffusion regions 55 and 56 are formed with the gate electrode 54 and the field oxide film 52 by a self alignment on the surface of the substrate, The dopant diffusion region 55 is at a high concentration of an n+ type dopant and the dopant diffusion region 56 is at a low concentration of an n− type dopant so that it is used as a resistive element. Such a selective implantation of introduced dopants is carried out by using a resist mask 57 as shown in the drawing. Ion implantation for providing a high resistance enables the n− type of dopant diffusion region 56 to function as a resistive element between the access transistor and the flip-flop, resulting in that miniaturization of memory cell and an enhancement in the cell memory ration can be achieved.

Figure 11:
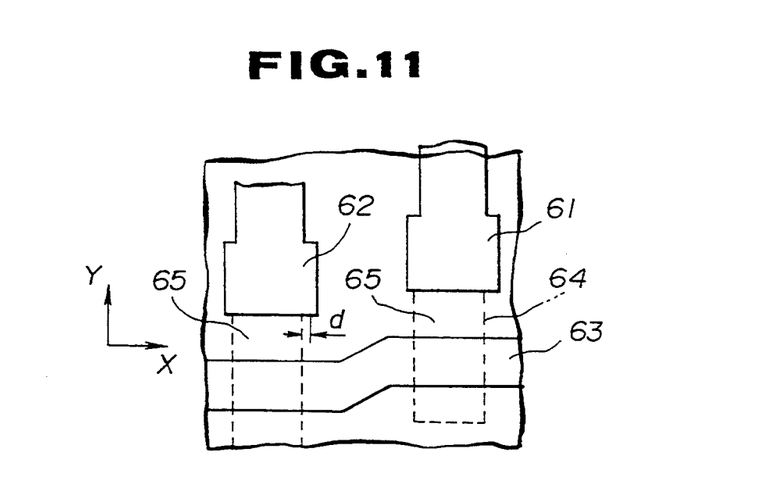
FIG. 11 is a plan view showing a misalignment which occurs in a step for forming a low dose region of a memory cell by a self alignment technique.

FIG. 11 is a cut-away plan view showing a part of a memory cell in which misalignment occurs. Polysilicon layers 61 and 62 which will form gate electrodes of the drive transistors and a polysilicon layer 63 which will form a gate electrode (word line) of an access transistor are misaligned by a length d from a pattern 64 of the field oxide layer. The region of the high resistive region 65 which functions as a resistive element never changes. This shows that the high resistive region 65 can be obtained at a high reproducibility so far as the high resistive region 65 is formed with the polysilicon layer which will form a gate electrode (word line) and the field oxide film by a self-alignment. The mask misalignment may occur in a Y direction as well as in an X direction. Even if more or less mask misalignment occurs, the region of the high resistive region 65 would never change.

Having described a process for forming resistive elements between access transistors and a flip-flop with reference to a selective implantation of low and high concentration dopants, the present invention is not limited. The other methods may be carried out in lieu of the selective implantation method.

What is claimed is:

1. A semiconductor memory having memory cells, each of the memory cells including a flip-flop including a pair of inverters with driver transistors, said each of the memory cells also including a pair of access transistors connected to the flip-flop, said each memory cell comprising:
   a resistive element disposed between said flip-flop and each of the pair of access transistors, said resistive elements being connected in series between drains of the driver transistors and source/drains of the access transistors, said resistive elements being separated from one another by a field insulation film and conductive gate layers of the flip-flop;

wherein said pair of access transistors are parallel to one another and have gate electrodes formed of a curved polysilicon layer, a first of said driver transistors having a gate formed of a generally J-shaped polysilicon layer, a first end of said generally J-shaped polysilicon layer connected to one of said resistive elements and a second end of said generally J-shaped polysilicon layer connected to a drain of a second of said driver transistors, said second of said driver transistors having a gate formed of a generally I-shaped polysilicon layer having a first end connected to another of said resistive elements and a second end connected to a drain of said first driver transistor.

2. A semiconductor memory cell, comprising:
 a pair of inverters having drive transistors and connected as a flip-flop, said inverters each having a memory node at respective drains of said drive transistors, a first of said drive transistors having a gate formed by a generally J-shaped layer having one end connected to a drain of a second of said drive transistors, said second of said drive transistors having a gate formed by a generally I-shaped layer having one end connected to a drain of said first drive transistor;
 a pair of resistive elements each connected to said memory node, a first of said pair of resistive elements being a resistive region connected to a second end of said J-shaped layer of said first drive transistor, a second of said pair of resistive elements being a resistive region connected to a second end of said I-shaped layer of said second drive transistor; and
 a pair of access transistors each connected in series to respective one of said pair of resistive elements so that only said resistive elements are connected between said drive transistors and said access transistors, said pair of access transistors having a single layer forming gate electrodes for both of said pair of access transistors.

3. A semiconductor memory cell as claimed in claim 2, wherein said J-shaped layer and said I-shaped layer and said single layer are polysilicon layers formed on a substrate.

4. A semiconductor memory cell as claimed in claim 2, wherein said access transistors are parallel to one another.

5. A semiconductor memory cell, comprising:
 a substrate;
 a curved first layer on said substrate forming gate electrodes of first and second access transistors, said first and second access transistors being mutually parallel;
 a generally J-shaped second layer on said substrate forming a gate of a first drive transistor and having first and second ends, said first end of said second layer being connected to a drain of a second drive transistor;
 a generally I-shaped third layer on said substrate forming a gate of the second drive transistor and having first and second ends, said first end of said third layer being connected to a drain of said first drive transistor;
 a first resistive region interpositioned on said substrate between said second end of said second layer and said first access transistor; and
 a second resistive region interpositioned on said substrate between said second end of said third layer and said second access transistor.

* * * * *